US011290071B2

(12) United States Patent
Zanbaghi et al.

(10) Patent No.: US 11,290,071 B2
(45) Date of Patent: Mar. 29, 2022

(54) COMMON-MODE INSENSITIVE CURRENT-SENSING TOPOLOGY IN FULL-BRIDGE DRIVER

(71) Applicant: Cirrus Logic International Semiconductor Ltd., Edinburgh (GB)

(72) Inventors: Ramin Zanbaghi, Austin, TX (US); Cory J. Peterson, Austin, TX (US); Anand Ilango, Austin, TX (US); Eric Kimball, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/003,564

(22) Filed: Aug. 26, 2020

(65) Prior Publication Data

US 2021/0344310 A1 Nov. 4, 2021

Related U.S. Application Data

(63) Continuation-in-part of application No. 16/864,893, filed on May 1, 2020.

(51) Int. Cl.
*H03F 3/217* (2006.01)
*H03F 3/45* (2006.01)
(Continued)

(52) U.S. Cl.
CPC ........... *H03F 3/2173* (2013.01); *G01R 1/203* (2013.01); *G01R 19/16538* (2013.01);
(Continued)

(58) Field of Classification Search
CPC . H03F 3/2173; H03F 1/38; H03F 3/45; G01R 19/16538; G01R 1/203; G01R 19/175; H04R 1/1016; G05F 1/461
(Continued)

(56) References Cited

U.S. PATENT DOCUMENTS 5,703,490 A 12/1997 Kennedy
8,081,028 B2 * 12/2011 Kost ..................... H03F 3/2173
330/10
(Continued)

FOREIGN PATENT DOCUMENTS

EP 2284992 A1 2/2011

OTHER PUBLICATIONS

Combined Search and Examination Report under Sections 17 and 18(3), UKIPO, Application No. GB2105612.2, dated Oct. 6, 2021.
(Continued)

*Primary Examiner* — Hieu P Nguyen
(74) *Attorney, Agent, or Firm* — Jackson Walker L.L.P.

(57) ABSTRACT

A system may include a Class-D stage comprising a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal. The system may also include current sensing circuitry comprising a first sense resistor coupled between the first high-side switch and the supply voltage, such that an output current through a load coupled between the first output terminal and the second output terminal causes a first sense voltage proportional to the output current across the first sense resistor when the first high-side switch is activated. The current sensing circuitry may also include a second sense resistor coupled between the second high-side switch and the supply voltage, such that an output current through the load causes a second sense voltage proportional to the output current across the second sense resistor when the second high-side switch is activated. The system may also include measure-
(Continued)

ment circuitry configured to measure the first sense voltage and the second sense voltage to determine the output current.

20 Claims, 8 Drawing Sheets

(51) Int. Cl.
    *H03F 1/38*     (2006.01)
    *G05F 1/46*     (2006.01)
    *H04R 1/10*     (2006.01)
    *G01R 1/20*     (2006.01)
    *G01R 19/175*     (2006.01)
    *G01R 19/165*     (2006.01)

(52) U.S. Cl.
    CPC ........... *G01R 19/175* (2013.01); *G05F 1/461* (2013.01); *H03F 1/38* (2013.01); *H03F 3/45* (2013.01); *H04R 1/1016* (2013.01)

(58) Field of Classification Search
    USPC ........................................ 330/251, 10, 207 A
    See application file for complete search history.

(56) References Cited

U.S. PATENT DOCUMENTS

| | | | |
|---|---|---|---|
| 8,378,745 B2 * | 2/2013 | Dooper | H03F 3/2173 |
| | | | 330/251 |
| 10,206,037 B2 * | 2/2019 | Chawla | H04R 3/007 |
| 2013/0223649 A1 | 8/2013 | Srivastava et al. | |
| 2016/0182998 A1 | 6/2016 | Galal et al. | |

OTHER PUBLICATIONS

Combined Search and Examination Report under Sections 17 and 18(3), UKIPO, Application No. GB2110933.5, dated Jan. 18, 2022.

* cited by examiner

COMMON-MODE INSENSITIVE CURRENT-SENSING TOPOLOGY IN FULL-BRIDGE DRIVER

RELATED APPLICATION

The present disclosure claims priority as a continuation-in-part application to U.S. application Ser. No. 16/864,893 filed May 1, 2020, which is incorporated by reference herein in its entirety.

FIELD OF DISCLOSURE

The present disclosure relates in general to circuits for audio devices, piezoelectric devices, and/or haptic-feedback devices, including without limitation personal audio devices such as wireless telephones, media players, and mobile devices, and more specifically, to a circuit topology for sensing current in a full-bridge driver.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones, one or more speakers, a piezoelectric transducer, a haptic feedback transducer, and/or other transducer. Such circuitry often includes a driver including a power amplifier for driving a transducer output signal to the transducer. Oftentimes, a power converter may be used to provide a supply voltage to a power amplifier in order to amplify a signal driven to speakers, headphones, piezoelectric transducers, haptic feedback transducers, or other transducers.

In many of such devices, a transducer may be driven with a Class-D driver stage, which may also be known as an H-bridge driver. FIG. 1 depicts an example of a Class-D driver stage 1 as is known in the art, having a voltage supply $V_{SUPPLY}$, high-side driver switches 2, low-side driver switches 4, and a current sense resistor 8 having a resistance $R_{SNS}$. In operation, switches 2 and 4 may be commutated by pulse-width modulated signals to drive a desired output voltage $V_{OUT}$ to transducer 6, causing an output current $I_{OUT}$ through transducer 6. A sense voltage $V_{SNS}$ may exist across sense resistor 8 equal to the product of output current $I_{OUT}$ and resistance $R_{SNS}$. Because sense voltage $V_{SNS}$ is linearly proportional to output current $I_{OUT}$, sense voltage $V_{SNS}$ may be indicative of output current $I_{OUT}$, and may thus be used by measurement circuitry, control circuitry, and/or other circuitry of a device comprising driver stage 1 and transducer 6 as a quantity representative of output current $I_{OUT}$.

While the topology depicted in FIG. 1 allows for sense resistor 8 to sense the complete output current $I_{OUT}$ through transducer 6, such topology does have disadvantages. For example, a common-mode component of sense voltage $V_{SNS}$ may exist at the negative polarity node of $V_{SNS}$, such common-mode component moving between supply voltage $V_{SUPPLY}$ and ground due to the periodic commutation of switches 2 and 4. Thus, the topology of FIG. 1 may be highly sensitive to common-mode leakage current through sense resistor 8.

SUMMARY

In accordance with the teachings of the present disclosure, one or more disadvantages and problems associated with existing approaches to measuring current through a transducer driven by a Class-D output stage may be reduced or eliminated.

In accordance with embodiments of the present disclosure, a system may include a Class-D stage comprising a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal. The system may also include current sensing circuitry comprising a first sense resistor coupled between the first high-side switch and the supply voltage, such that an output current through a load coupled between the first output terminal and the second output terminal causes a first sense voltage proportional to the output current across the first sense resistor when the first high-side switch is activated. The current sensing circuitry may also include a second sense resistor coupled between the second high-side switch and the supply voltage, such that an output current through the load causes a second sense voltage proportional to the output current across the second sense resistor when the second high-side switch is activated. The system may also include measurement circuitry configured to measure the first sense voltage and the second sense voltage to determine the output current.

In accordance with these and other embodiments of the present disclosure, a method may be provided for use in a Class-D stage comprising a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal. The method may include measuring a first sense voltage with a first sense resistor coupled between the first high-side switch and the supply voltage, such that an output current through a load coupled between the first output terminal and the second output terminal causes the first sense voltage proportional to the output current across the first sense resistor when the first high-side switch is activated. The method may also include measuring a second sense voltage with a second sense resistor coupled between the second high-side switch and the supply voltage, such that an output current through the load causes the second sense voltage proportional to the output current across the second sense resistor when the second high-side switch is activated. The method may further include determining the output current based on both of the first sense voltage and the second sense voltage.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
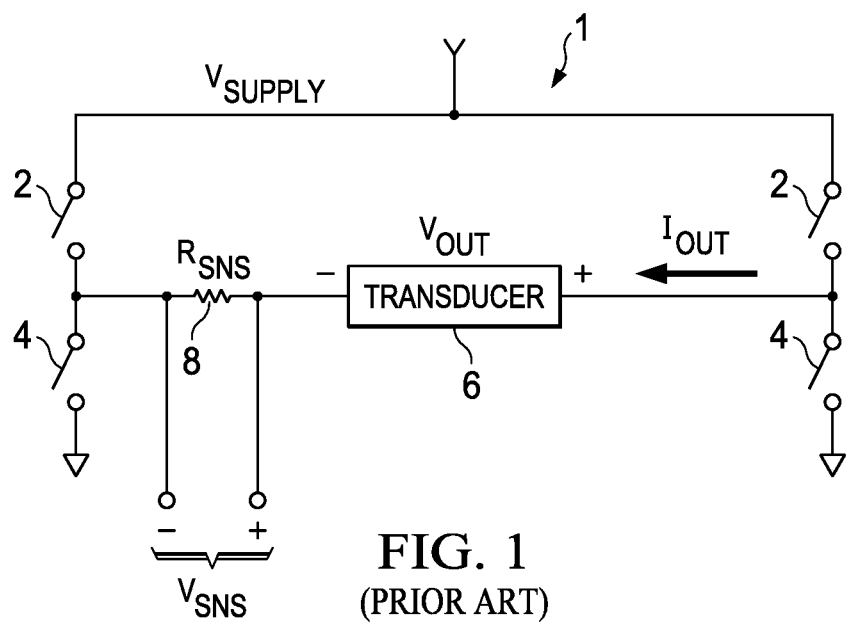
FIG. 1 illustrates an example circuit topology for a Class-D driver and transducer, as is known in the prior art.
Figure 2:
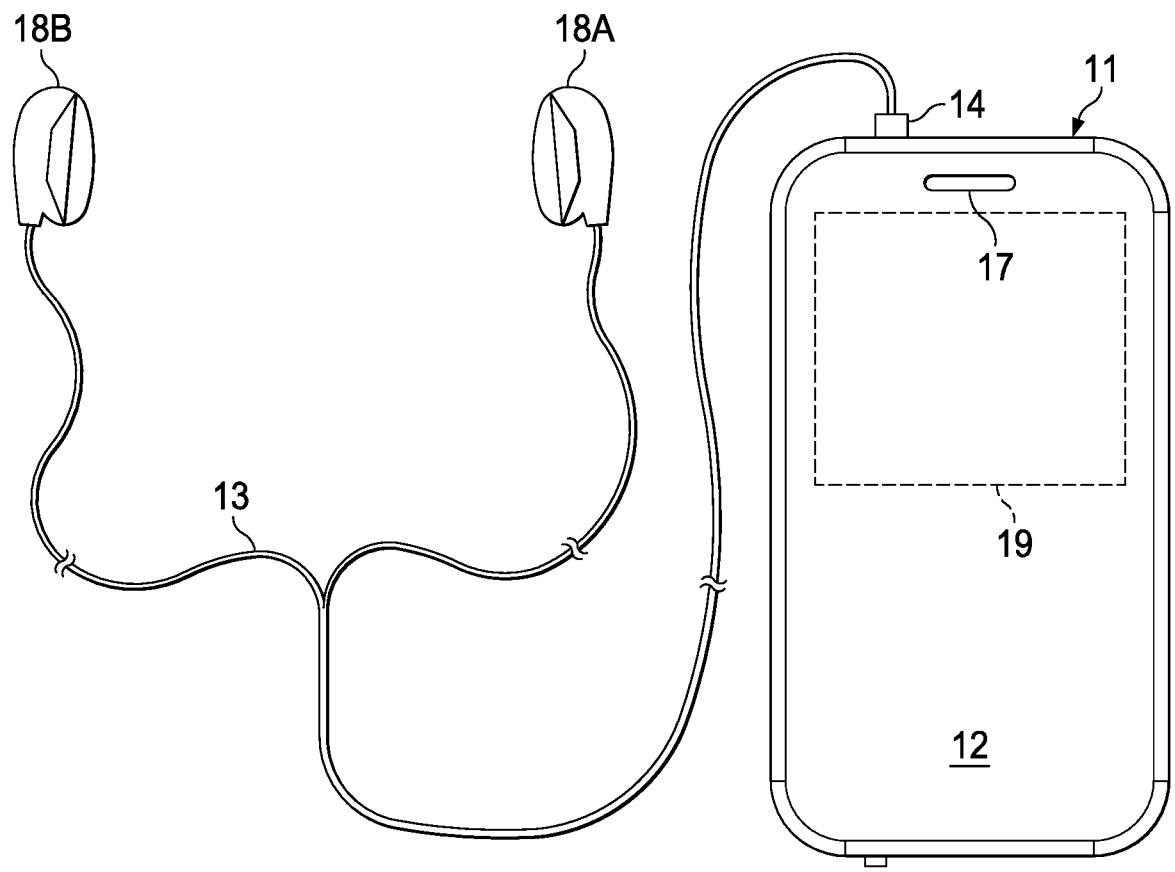
FIG. 2 illustrates an example personal mobile device, in accordance with embodiments of the present disclosure.

FIG. 2 illustrates an example personal mobile device 11, in accordance with embodiments of the present disclosure. FIG. 2 depicts personal mobile device 11 having a speaker 17. Speaker 17 is merely an example, and it is understood that personal mobile device 11 may be used in connection with a variety of transducers including magnetic coil loudspeakers, piezo speakers, haptic feedback transducers, and others. In addition or alternatively, personal mobile device 11 may be coupled to a headset 13 in the form of a pair of earbud speakers 18A and 18B. Headset 13 depicted in FIG. 2 is merely an example, and it is understood that personal mobile device 11 may be used in connection with a variety of audio transducers, including without limitation, headphones, earbuds, in-ear earphones, and external speakers. A plug 14 may provide for connection of headset 13 to an electrical terminal of personal mobile device 11. Personal mobile device 11 may provide a display to a user and receive user input using a touch screen 12, or alternatively, a standard liquid crystal display (LCD) may be combined with various buttons, sliders, and/or dials disposed on the face and/or sides of personal mobile device 11. As also shown in FIG. 2, personal mobile device 11 may include an integrated circuit (IC) 19 for generating an analog signal for transmission to speaker 17, headset 13, and/or another transducer.

Figure 3:
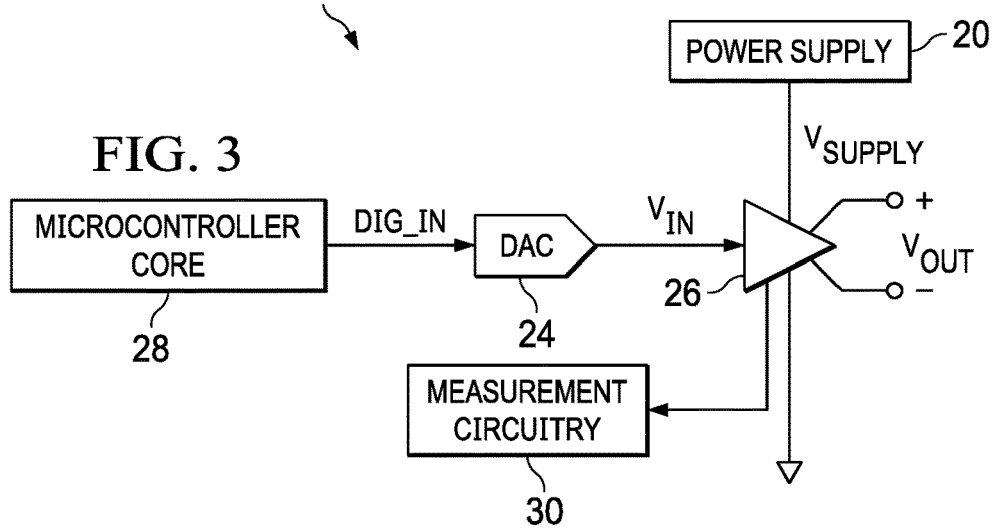
FIG. 3 illustrates a block diagram of selected components of an example integrated circuit of a personal mobile device for driving a transducer, in accordance with embodiments of the present disclosure.

FIG. 3 illustrates a block diagram of selected components of an example IC 19 of a personal mobile device for driving a transducer, in accordance with embodiments of the present disclosure. As shown in FIG. 3, a microcontroller core 28 may supply a digital input signal DIG_IN to a digital-to-analog converter (DAC) 24, which may convert the digital input signal to an analog input signal $V_{IN}$. In some embodiments, analog signal $V_{IN}$ may comprise a pulse-width modulated signal. In addition, although analog signal $V_{IN}$ is shown in FIG. 3 as a single-ended signal, in some embodiments analog signal $V_{IN}$ may comprise a differential signal. DAC 24 may supply analog signal $V_{IN}$ to an amplifier 26 which may amplify or attenuate analog input signal $V_{IN}$ to provide a differential output signal $V_{OUT}$, which may operate a speaker, a headphone transducer, a piezoelectric transducer, a haptic feedback transducer, a line level signal output, and/or other suitable output. In some embodiments, DAC 24 may be an integral component of amplifier 26, particularly in embodiments in which analog input signal $V_{IN}$ is a pulse-width modulated signal for driving switches of amplifier 26. In these and other embodiments, amplifier 26 may comprise a Class-D driver stage. A power supply 20 may provide the power supply rail inputs of amplifier 26.

As also depicted in FIG. 3, IC 19 may also include measurement circuitry 30. Measurement circuitry 30 may comprise any suitable system, device, or apparatus configured to receive one or more signals indicative of a physical quantity associated with amplifier 26 (e.g., an electrical current driven to a load of amplifier 26) and condition the one or more signals for further processing.

Although FIGS. 2 and 3 contemplate that IC 19 resides in a personal mobile device, systems and methods described herein may also be applied to electrical and electronic systems and devices other than a personal mobile device, including transducer systems for use in a computing device larger than a personal mobile device, such as an automobile, a building, or other structure.

Figure 4:
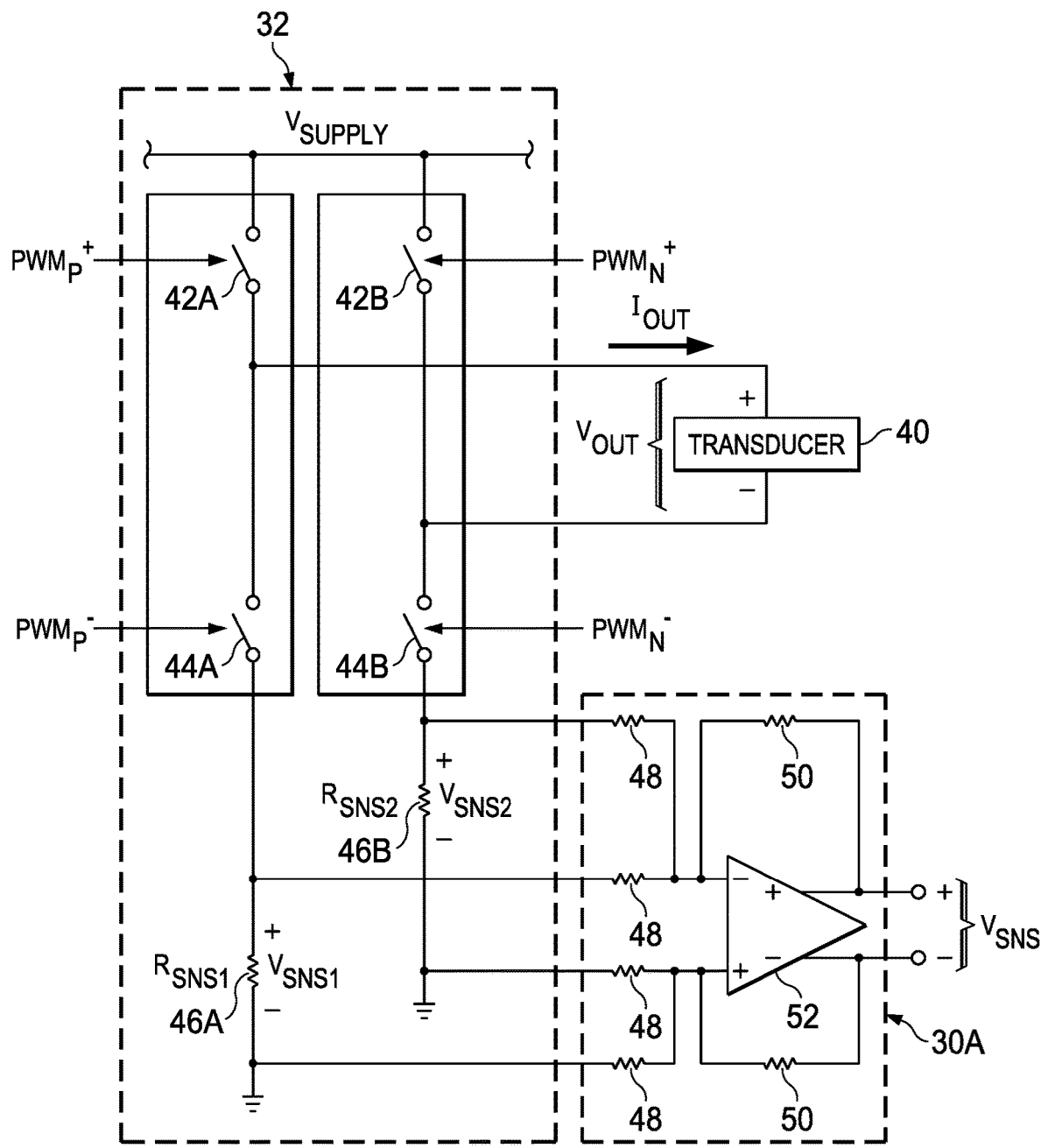
FIG. 4 illustrates a block and circuit diagram of selected components of an example Class-D stage and measurement circuit, in accordance with embodiments of the present disclosure.

FIG. 4 illustrates a block and circuit diagram of selected components of an example Class-D stage 32 and an analog front end (AFE) 30A that may be used to implement measurement circuitry 30, in accordance with embodiments of the present disclosure. In some embodiments, Class-D stage 32 may implement all or a portion of amplifier 26 described with respect to FIG. 3.

As shown in FIG. 4, Class-D stage 32 may drive output voltage $V_{OUT}$ to transducer 40 and include a high-side switch 42A coupled to supply voltage $V_{SUPPLY}$ and a low-side switch 44A coupled (via sense resistor 46A) to ground for driving a positive polarity output of Class-D stage 32. High-side switch 42A and low-side switch 44A may be controlled by complementary pulse-width modulation signals $PWM_{P+}$ and $PWM_{P-}$, respectively. Class-D stage 32 may also include a high-side switch 42B coupled to supply voltage $V_{SUPPLY}$ and a low-side switch 44B coupled (via sense resistor 46B) to ground for driving a negative polarity output of Class-D stage 32. High-side switch 42B and low-side switch 44B may be controlled by complementary pulse-width modulation signals $PWM_{N+}$ and $PWM_{N-}$, respectively.

In operation of Class-D stage 32, when low-side switch 44A is activated (e.g., on, closed, enabled), a sense voltage $V_{SNS1}$ may form across sense resistor 46A which is negative and equal in magnitude to the product of output current $I_{OUT}$ through transducer 40 and resistance $R_{SNS1}$ of sense resistor 46A. Likewise, when low-side switch 44B is activated (e.g., on, closed, enabled), a sense voltage $V_{SNS2}$ may form across sense resistor 46B which is equal to the product of output current $I_{OUT}$ through transducer 40 and resistance $R_{SNS2}$ of sense resistor 46B. Thus, in either case, the sense voltages $V_{SNS1}$ and $V_{SNS2}$ may be proportional to output current $I_{OUT}$, and thus may be indicative of output current $I_{OUT}$.

As shown in FIG. 4, AFE 30A may comprise a differential gain amplifier comprising an operational amplifier 52, input resistors 48, and feedback resistors 50. Thus, the differential gain amplifier may generate a differential output voltage $V_{SNS}$ which is an amplified version of the difference between sense voltages $V_{SNS1}$ and $V_{SNS2}$, the differential gain amplifier having a gain set by a ratio of resistances of feedback resistors 50 to input resistors 48. In some embodiments, AFE 30A and measurement circuitry 30 may include additional components not explicitly shown in FIG. 4, including, without limitation, filters (e.g., anti-aliasing filters), an analog-to-digital converter, and/or other components.

Figure 6:
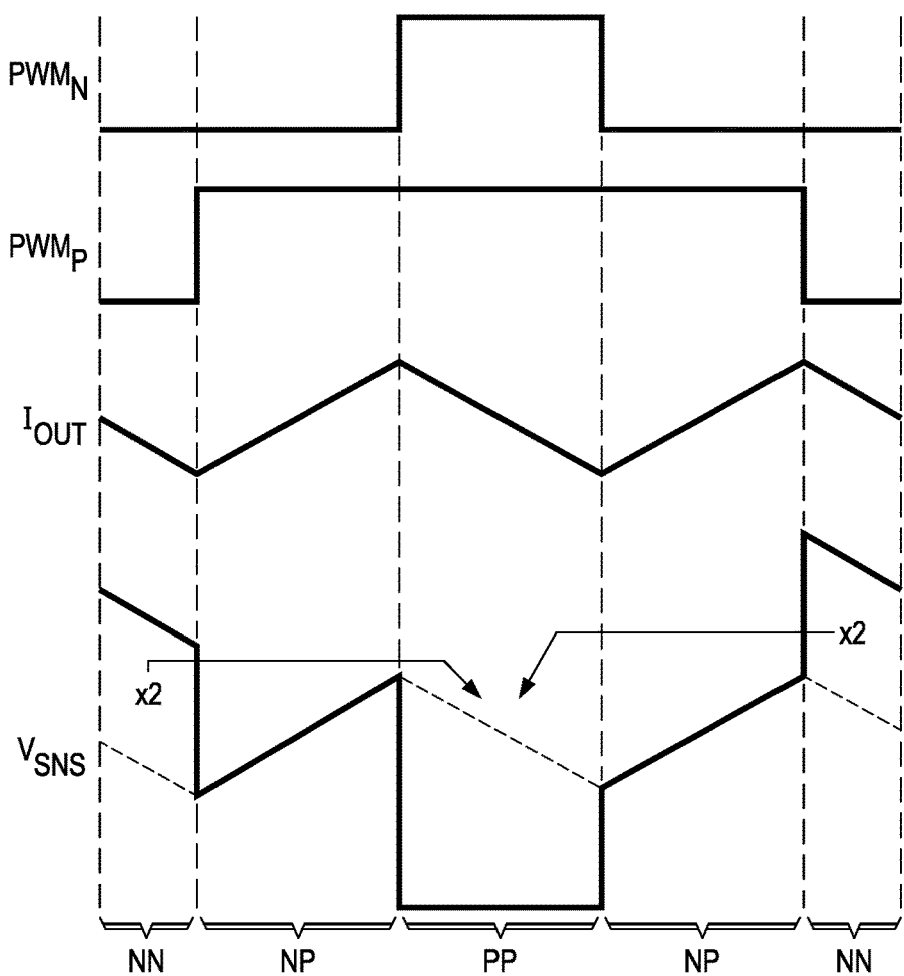
FIG. 6 depicts example waveforms for PWM control signals, output current generated based on the PWM control signals, and a sense voltage that may be generated based on current flowing through the sense resistors of FIG. 4 in the various phases depicted in FIG. 5, in accordance with embodiments of the present disclosure.
Figure 5:
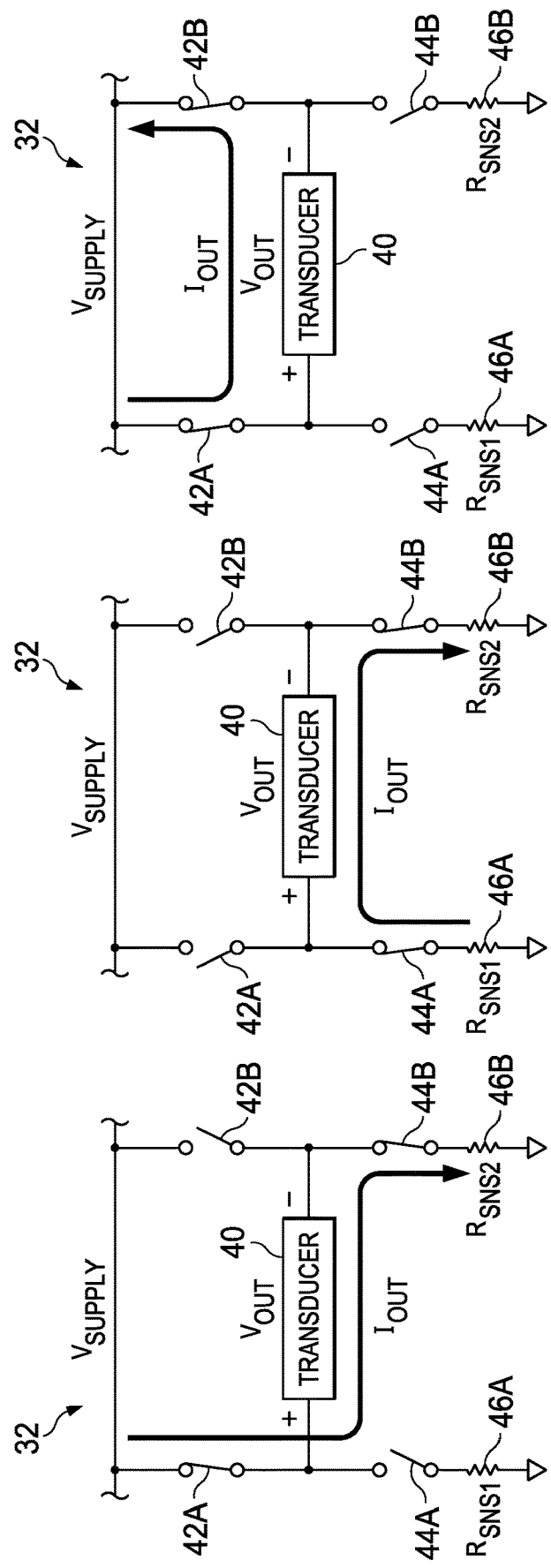
FIG. 5 depicts a Class-D amplifier in various example phases of its switches for a positive output current and the path of electrical current flow in each of the example phases, in accordance with embodiments of the present disclosure.

Current sense operation of Class-D stage 32 and measurement circuitry 30 may be illustrated in FIGS. 5 and 6. FIG. 5 depicts Class-D stage 32 in various example phases of switches 42A, 42B, 44A, and 44B for positive output current $I_{OUT}$ and the path of electrical current flow in each of the example phases. FIG. 6 depicts example waveforms for PWM control signals $PWM_P$ and $PWM_N$ (e.g., $PWM_P = PWM_{P'} - PWM_{P'}$; $PWM_N = PWM_{N'} - PWM_{N'}$), output current $I_{OUT}$ generated based on PWM control signals $PWM_P$ and $PWM_N$, and sense voltage $V_{SNS}$ that may be generated based on current flowing through sense resistors 46A and 46B in the various phases.

In FIG. 6, the phases labeled NP may correspond to when high-switch 42A and low-side switch 44B are activated and high-side switch 42B and low-side switch 44A are deactivated, and a fully differential current flows through transducer 40 and sense resistor 46B. The phases labeled NN may correspond to when low-side switches 44A and 44B are activated and high-side switches 42A and 42B are deactivated and a common-mode current through transducer 40 flows through both sense resistors 46A and 46B. The phase labeled PP may correspond to when low-side switches 44A and 44B are deactivated and high-side switches 42A and 42B are activated and a common-mode current flows through transducer 40 but neither of sense resistors 46A and 46B.

From FIGS. 5 and 6, it is seen that current is sensed only in phases NP (which senses fully differential current) and phases NN (which senses common-mode current through low-side switches 44A and 44B) but not the common-mode current through high-side switches 42A and 42B in phase PP. Thus, the solid-line waveform for sense voltage $V_{SNS}$ may represent an actual output of measurement circuitry 30, while the dotted-line waveform represents an actual current. As is further seen, sense voltage $V_{SNS}$ in phase PP may be zero, despite the existence of non-zero current $I_{OUT}$ during such phase, while in phases NN, sensed voltage $V_{SNS}$ may represent twice the amount of the actual current $I_{OUT}$. As described in greater detail below, this 2× factor of sensed voltage $V_{SNS}$ during phases NN may compensate for the lack of common-mode current measurement during phase PP, so as to provide adequate energy balance, as the duration of phases NN and PP should be equal during operation of Class-D stage 32.

Accordingly, the topology shown in FIG. 4 may not suffer from the common-mode leakage disadvantages of existing approaches for current sensing in a Class-D stage, as the topology of FIG. 4 should experience no common-mode voltage variance at either terminal of sense resistors 46A and 46B. Further, through use of the topology of measurement circuit 30 shown in FIG. 4, the topology of Class-D stage 32 may be highly insensitive to any routing resistance mismatch to ground between sense resistors 46A and 46B.

Referring back to FIG. 6, if the phases NN and PP are matched in duration, then the 2× factor of sensed voltage $V_{SNS}$ during phases NN may compensate for the lack of common-mode measured energy during phases PP. However, while matching durations for phases NN and phases PP are ideal, switch drivers for switches 42A, 42B, 44A, and 44B and mismatches among switches 42A, 42B, 44A, and 44B may impose non-idealities preventing durations for phases NN and phases PP from matching. Accordingly, if the average common-mode current for phases PP is lower than the average common-mode current for phases NN, then the multiplicative factor of sensed voltage $V_{SNS}$ during phases NN may need to be lower than 2×. Likewise, if the average common-mode current for phases PP is higher than the average common-mode current for phases NN, then the multiplicative factor of sensed voltage $V_{SNS}$ during phases NN may need to be higher than 2×. Accordingly, applying calibration to sense resistors 46A and 46B may be desirable to ensure measurement accuracy and precision.

However, applying a fixed calibration on either or both of sense resistors 46A and 46B may affect measurement of fully-differential common-mode current, which may be undesirable. Therefore, as described in greater detail below, the present disclosure may implement a calibration scheme in which calibration is applied to sense resistor 46A when sense resistor 46B is in the fully-differential current path, and in which calibration is applied to sense resistor 46B when sense resistor 46A is in the fully-differential current path.

Figure 7:
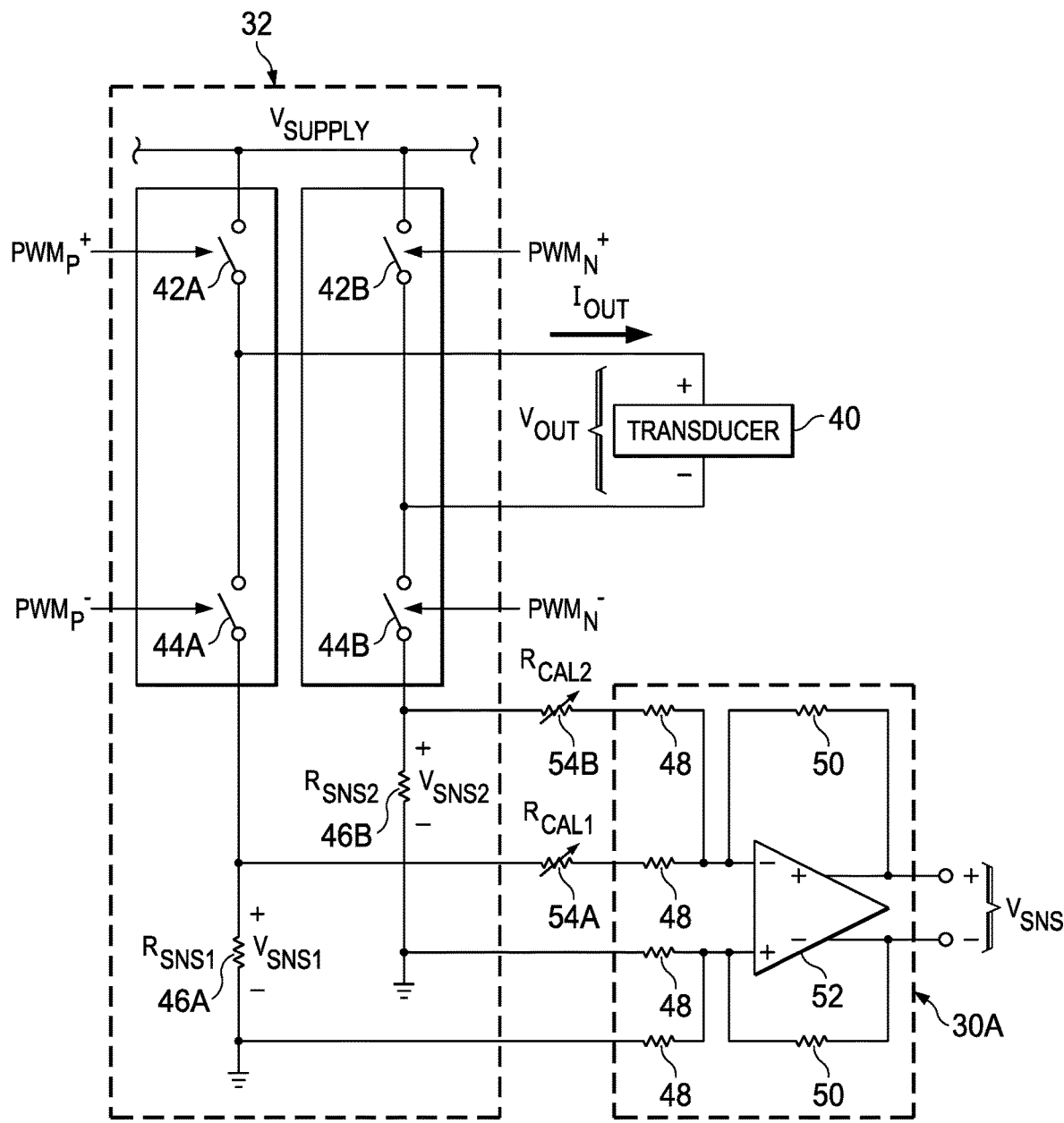
FIG. 7 illustrates the selected components of the example Class-D stage and measurement circuit of FIG. 4 including calibration resistors, in accordance with embodiments of the present disclosure.

FIG. 7 illustrates the selected components of the example Class-D stage 32 and measurement circuitry 30 of FIG. 4 including calibration resistors 54A and 54B, in accordance with embodiments of the present disclosure. As shown in FIG. 7, calibration resistor 54A may have a variable controlled resistance $R_{CAL1}$ and may be coupled between an input resistor 48 and the terminal of sense resistor 46A coupled to low-side switch 44A. Similarly, calibration resistor 54B may have a variable controlled resistance $R_{CAL2}$ and may be coupled between an input resistor 48 and the terminal of sense resistor 46B coupled to low-side switch 44B. In operation, calibration resistor 54A may be controlled by an appropriate subsystem (e.g., microcontroller core 28) to set variable resistance $R_{CAL1}$ to compensate for mismatches between the durations of phases NN and PP as shown in FIG. 6. Similarly, calibration resistor 54B may be controlled by an appropriate subsystem (e.g., microcontroller core 28) to set variable resistance $R_{CAL2}$ to compensate for mismatches between durations of phases NN and PP similar to that shown in FIG. 6.

Although the foregoing contemplates varying resistances of calibration resistors 54A and 54B to compensate for mismatches between the durations of phases NN and PP, in some embodiments, in addition to or in lieu of using calibration resistors 54A and 54B to compensate for mismatches, feedback resistors 50 may have variable resistances (or may be fixed but in series with a variable resistor) that may be varied to compensate for mismatches between the durations of phases NN and PP.

Figure 8:
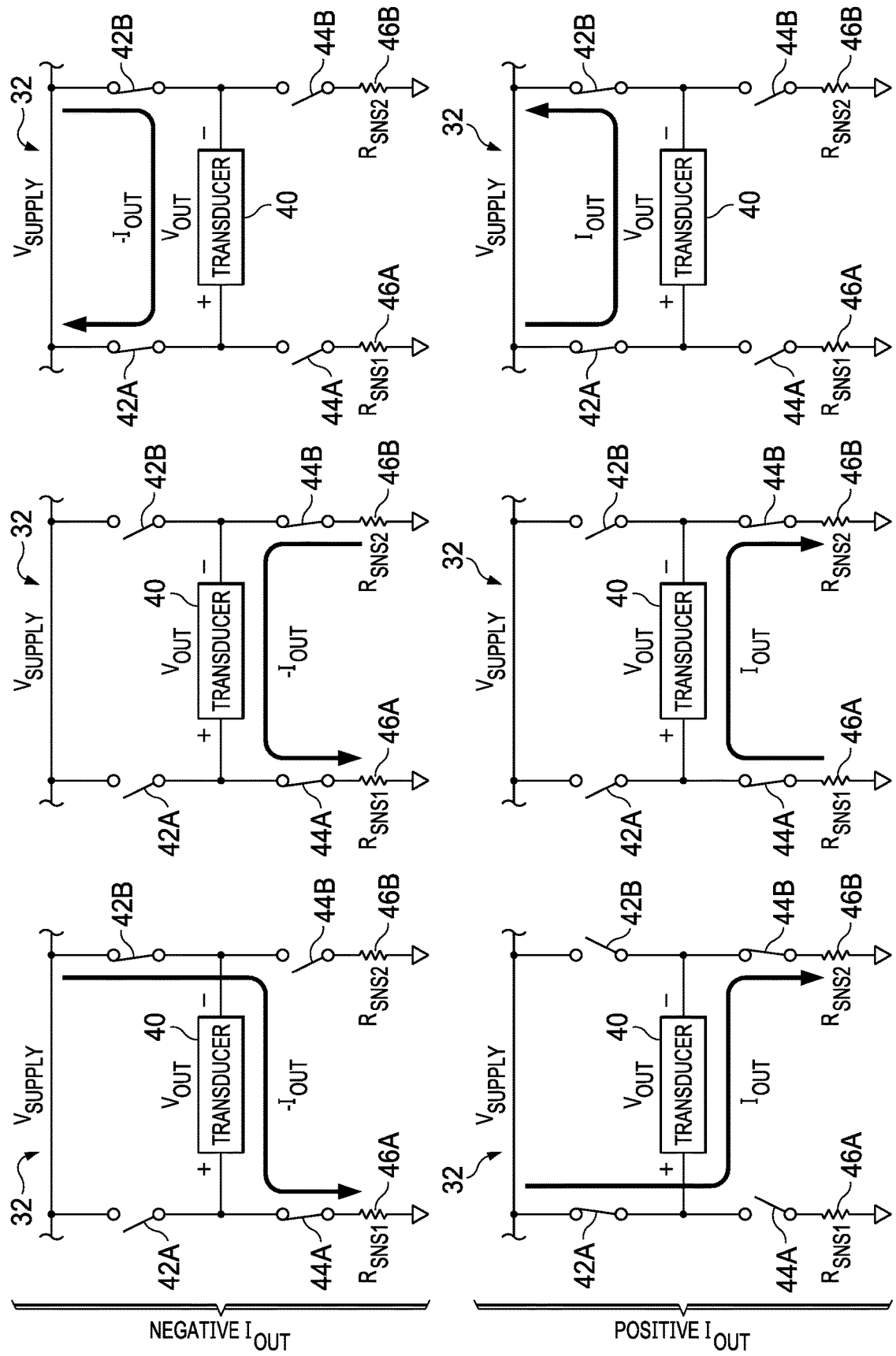
FIG. 8 depicts a Class-D amplifier in various example phases of its switches for negative and positive output currents and the path of electrical current flow in each of the example phases, in accordance with embodiments of the present disclosure.

FIG. 8 further illustrates the times at which compensation may be applied using calibration resistor 54A and the times at which compensation may be applied using calibration resistor 54B. FIG. 8 depicts Class-D stage 32 in various example phases of switches 42A, 42B, 44A, and 44B for both negative and positive output current $I_{OUT}$ and the path of electrical current flow in each of the example phases. From FIG. 8, it may be seen that for negative current $I_{OUT}$, sense resistor 46A is in the fully-differential current sensing path, while sense resistor 46B is not in the fully-differential current sensing path. Accordingly, when output current $I_{OUT}$ is negative, compensation may be applied to sense resistor 46B by controlling variable resistance $R_{CAL2}$ of calibration resistor 54B to offset mismatch between the durations of NN phases and PP phases of Class-D stage 32. Similarly, when output current $I_{OUT}$ is positive, compensation may be applied to sense resistor 46A by controlling variable resistance $R_{CAL1}$ of calibration resistor 54A to offset mismatch between the durations of NN phases and PP phases of Class-D stage 32. Accordingly, alternation between calibration of calibration resistor 54A and calibration of calibration resistor 54B may occur at a zero-crossing of output current $I_{OUT}$. In some instances, a polarity of digital input signal DIG_IN may be indicative of the polarity of output current $I_{OUT}$. Accordingly, a sign bit of digital input signal DIG_IN indicating its polarity may serve as a control signal for alternating between calibration of calibration resistor 54A and calibration of calibration resistor 54B.

While using sense resistors 46A and 46B on a low-side of Class-D stage 32 has advantages, among the disadvantages of the approach of using only low-side sense resistors 46A and 46B are that any energy mismatches between the NN phases and the PP phases may lead to measurement error. For example, such energy mismatch may create a significant current-to-voltage gain error.

Figure 9:
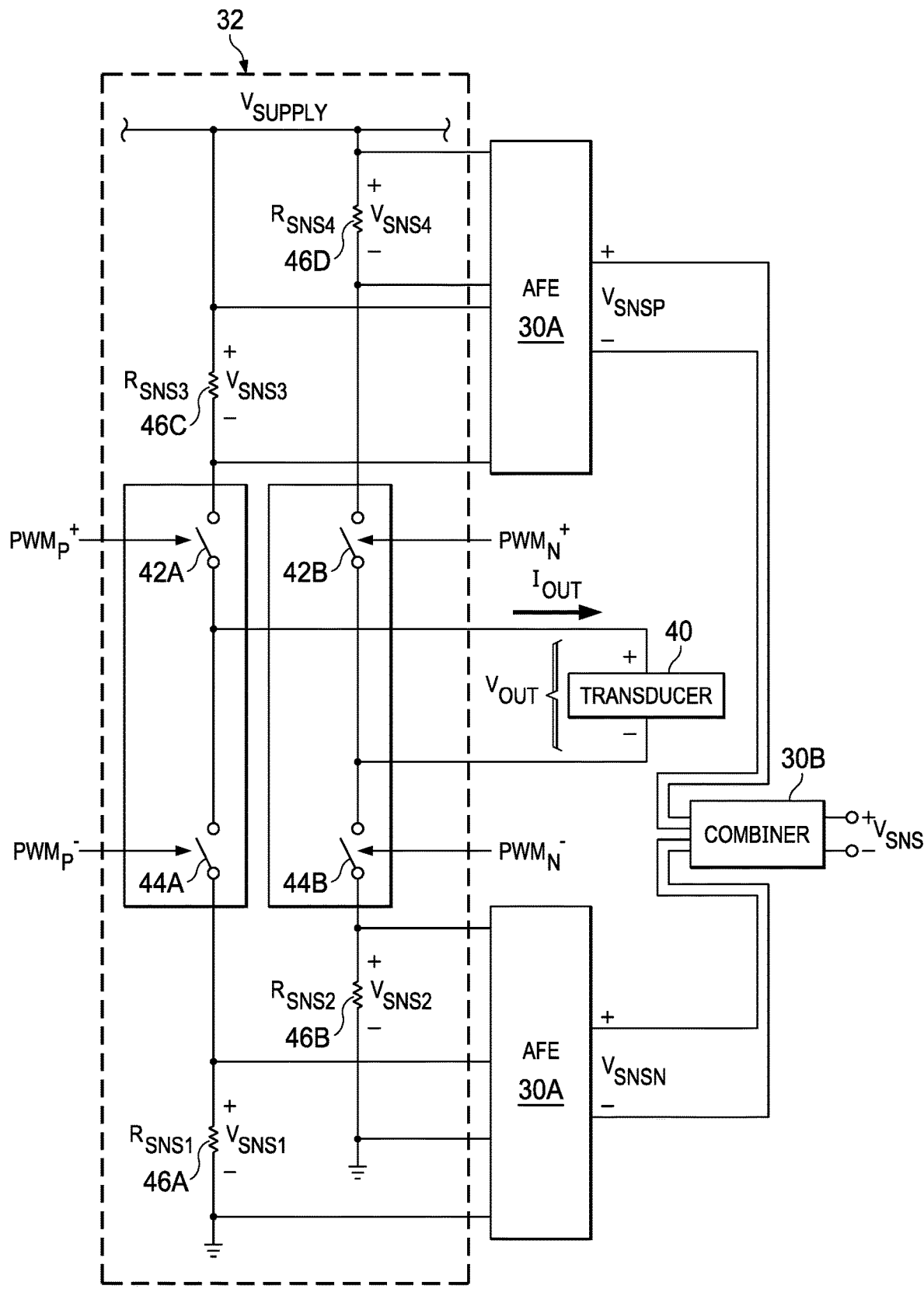
FIG. 9 illustrates a block and circuit diagram of selected components of an example Class-D stage and AFEs and combiner that may be used to implement measurement circuitry, in accordance with embodiments of the present disclosure.

FIG. 9 illustrates a block and circuit diagram of selected components of an example Class-D stage 32 and AFEs 30A and combiner 30B that may be used to implement measurement circuitry 30, in accordance with embodiments of the present disclosure. In some embodiments, Class-D stage 32 may implement all or a portion of amplifier 26 described with respect to FIG. 3.

As shown in FIG. 9, Class-D stage 32 may drive output voltage $V_{OUT}$ to transducer 40 and include a high-side switch 42A coupled (via sense resistor 46C) to supply voltage $V_{SUPPLY}$ and a low-side switch 44A coupled (via sense resistor 46A) to ground for driving a positive polarity output of Class-D stage 32. High-side switch 42A and low-side switch 44A may be controlled by complementary pulse-width modulation signals $PWM_{P^+}$ and $PWM_{P^-}$, respectively. Class-D stage 32 may also include a high-side switch 42B coupled (via sense resistor 46D) to supply voltage $V_{SUPPLY}$ and a low-side switch 44B coupled (via sense resistor 46B) to ground for driving a negative polarity output of Class-D stage 32. High-side switch 42B and low-side switch 44B may be controlled by complementary pulse-width modulation signals $PWM_{N^+}$ and $PWM_{N^-}$, respectively.

In operation of Class-D stage 32, when low-side switch 44A is activated (e.g., on, closed, enabled), a sense voltage $V_{SNS1}$ may form across sense resistor 46A which is negative and equal in magnitude to the product of output current $I_{OUT}$ through transducer 40 and resistance $R_{SNS1}$ of sense resistor 46A. Likewise, when low-side switch 44B is activated (e.g., on, closed, enabled), a sense voltage $V_{SNS2}$ may form across sense resistor 46B which is equal to the product of output current $I_{OUT}$ through transducer 40 and resistance $R_{SNS2}$ of sense resistor 46B. Further, when high-side switch 42A is activated (e.g., on, closed, enabled), a sense voltage $V_{SNS3}$ may form across sense resistor 46C which is negative and equal in magnitude to the product of output current $I_{OUT}$ through transducer 40 and resistance $R_{SNS3}$ of sense resistor 46C. Moreover, when high-side switch 42B is activated (e.g., on, closed, enabled), a sense voltage $V_{SNS4}$ may form across sense resistor 46D which is equal to the product of output current $I_{OUT}$ through transducer 40 and resistance $R_{SNS4}$ of sense resistor 46D. Thus, in all of these cases, the sense voltages $V_{SNS1}$, $V_{SNS2}$, $V_{SNS3}$, and $V_{SNS4}$ may each be proportional to output current $I_{OUT}$, and thus may be indicative of output current $I_{OUT}$.

As shown in FIG. 9, one AFE 30A may generate a differential output voltage $V_{SNSN}$ which is an amplified version of the difference between sense voltages $V_{SNS1}$ and $V_{SNS2}$, while another AFE 30A may generate a differential output voltage $V_{SNSP}$ which is an amplified version of the difference between sense voltages $V_{SNS3}$ and $V_{SNS4}$. Thus, differential output voltage $V_{SNSN}$ may be proportional to the sum $I_{NP}+2I_{PP}$, where $I_{NP}$ is output current $I_{OUT}$ during NP phases and $I_{PP}$ is output current $I_{OUT}$ during PP phases. Likewise, differential output voltage $V_{SNSP}$ may be proportional to the sum $I_{NP}+2I_{NN}$, where $I_{NN}$ is output current $I_{OUT}$ during NN phases. Accordingly, combiner 30B may sum differential output voltage $V_{SNSN}$ and differential output voltage $V_{SNSP}$ to generate sensed voltage $V_{SNS}$ indicative of output current $I_{OUT}$ across all phases. For example, by simply summing differential output voltage $V_{SNSN}$ and differential output voltage $V_{SNSP}$, sensed voltage $V_{SNS}$ may be proportional to the sum $2I_{NP}+2I_{NN}+2I_{PP}$, which represents two times output current $I_{OUT}$ across all phases. Accordingly, combiner 30B may be configured to divide the sum of differential output voltage $V_{SNSN}$ and differential output voltage $V_{SNSP}$ by a factor of two (or any other appropriate factor) in order to generate sensed voltage $V_{SNS}$.

In some embodiments, measurement circuitry 30 may include additional components other than AFEs 30A and combiner 30B not explicitly shown in FIG. 9, including, without limitation, filters (e.g., anti-aliasing filters), an analog-to-digital converter, and/or other components.

Figure 10:
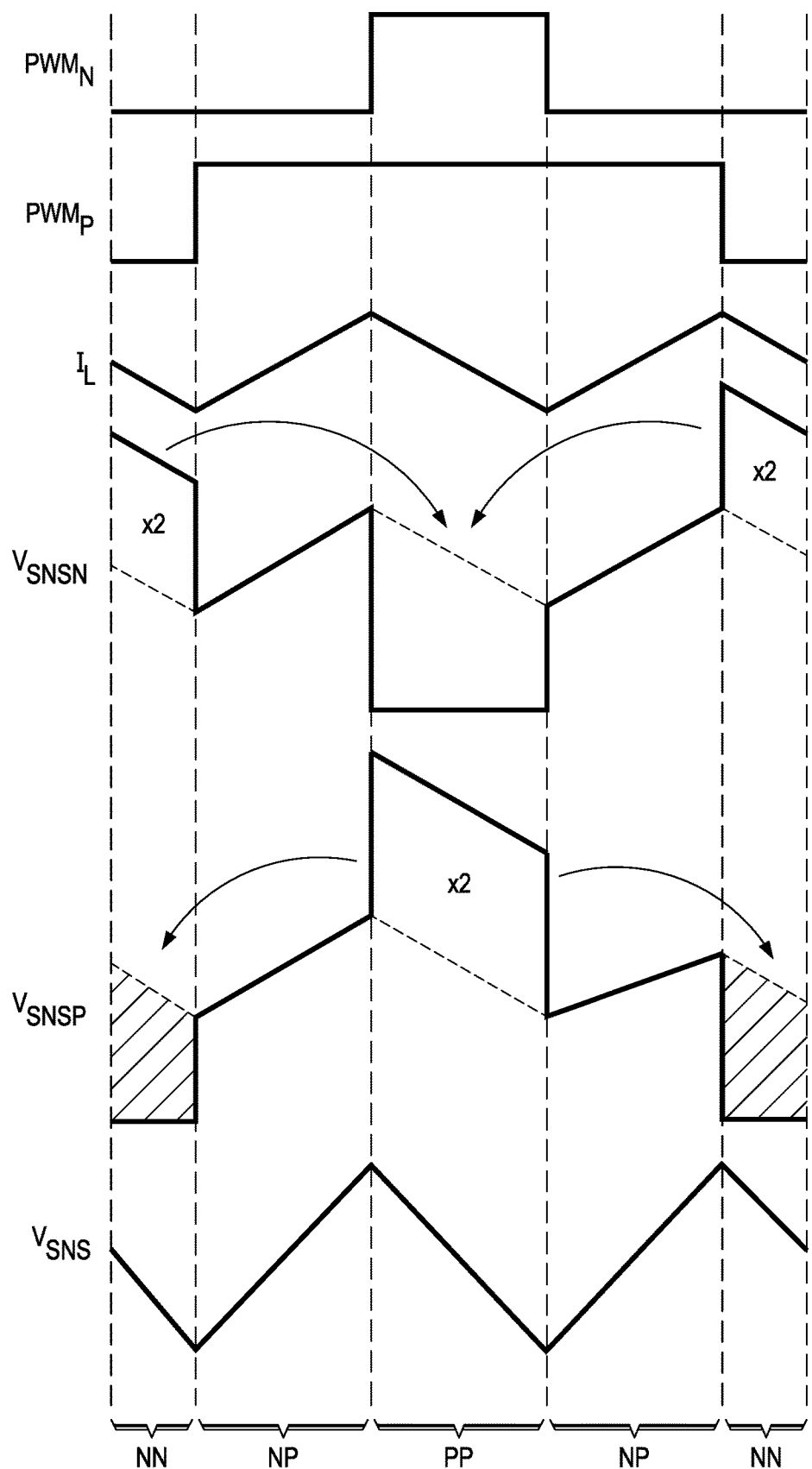
FIG. 10 depicts example waveforms for PWM control signals, output current generated based on the PWM control signals, and a sense voltage that may be generated based on current flowing through the sense resistors of FIG. 8 in various phases of its operation, in accordance with embodiments of the present disclosure.

FIG. 10 depicts example waveforms for PWM control signals $PWM_P$ and $PWM_N$ (e.g., $PWM_P=PWM_{P^+}-PWM_{P^-}$; $PWM_N=PWM_{N^+}-PWM_{N^-}$), output current $I_{OUT}$ generated based on PWM control signals $PWM_P$ and $PWM_N$, differential voltage $V_{SNSN}$ that may be generated based on current flowing through sensor resistors 46A and 46B in the various phases, differential voltage $V_{SNSP}$ that may be generated based on current flowing through sensor resistors 46C and 46D in the various phases, and sensed voltage $V_{SNS}$ that may be generated by the summation of differential voltage $V_{SNSN}$ and differential voltage $V_{SNSP}$ as described above (e.g., by combiner 30B).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
a Class-D stage comprising:
a first high-side switch coupled between a supply voltage and a first output terminal of the Class-D stage;
a second high-side switch coupled between the supply voltage and a second output terminal of the Class-D stage;
a first low-side switch coupled between a ground voltage and the first output terminal; and
a second low-side switch coupled between the ground voltage and the second output terminal; and
current sensing circuitry comprising:
a first sense resistor coupled between the first high-side switch and the supply voltage, such that an output current through a load coupled between the first output terminal and the second output terminal causes a first sense voltage proportional to the output current across the first sense resistor when the first high-side switch is activated;
a second sense resistor coupled between the second high-side switch and the supply voltage, such that an output current through the load causes a second sense voltage proportional to the output current across the second sense resistor when the second high-side switch is activated; and
measurement circuitry configured to measure the first sense voltage and the second sense voltage to determine the output current; and
a calibration subsystem comprising a first calibration resistor and a second calibration resistor and configured to calibrate for mismatch between common mode phases of the Class-D stage.

2. The system of claim 1, wherein the measurement circuitry comprises an amplifier configured to amplify a difference between the first sense voltage and the second sense voltage to generate a combined sense voltage.

3. The system of claim 1, wherein the Class-D stage further comprises:
a third sense resistor coupled between the first low-side switch and the ground voltage, such that an output current through the load causes a third sense voltage proportional to the output current across the third sense resistor when the first low-side switch is activated; and
a fourth sense resistor coupled between the second low-side switch and the ground voltage, such that an output current through the load causes a fourth sense voltage proportional to the output current across the fourth sense resistor when the second low-side switch is activated;
wherein the measurement circuitry is configured to measure the third sense voltage and the fourth sense voltage to determine the output current.

4. The system of claim 3, wherein the measurement circuitry further comprises:
a first amplifier configured to amplify a difference between the first sense voltage and the second sense voltage to generate a high-side sense voltage; and
a second amplifier configured to amplify a difference between the third sense voltage and the fourth sense voltage to generate a low-side sense voltage.

5. The system of claim 4, wherein the measurement circuitry further comprises a combiner configured to combine the high-side sense voltage and the low-side sense voltage to generate a combined sense voltage indicative of the output current.

6. The system of claim 1, wherein the first calibration resistor is coupled between the first sense resistor and an amplifier and the second calibration resistor is coupled between the second sense resistor and the amplifier.

7. The system of claim 1, wherein the first calibration resistor and the second calibration resistor comprise feedback resistors of an amplifier.

8. The system of claim 1, wherein the calibration subsystem is further configured to:
calibrate a first variable resistance of the first calibration resistor when the second sense resistor is in a fully-differential current path of the output current; and
calibrate a second variable resistance of the second calibration resistor when the first sense resistor is in the fully-differential current path of the output current.

9. The system of claim 1, wherein the calibration subsystem is further configured to:

calibrate a first variable resistance of the first calibration resistor when a polarity of the output current is a first polarity; and calibrate a second variable resistance of the first calibration resistor when the polarity of the output current is a second polarity.

10. The system of claim 9, wherein the calibration subsystem is further configured to alternate between calibration of the first variable resistance and the second variable resistance, and vice versa, at zero crossings of the output current.

11. A method, in a Class-D stage comprising a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal, comprising:

measuring a first sense voltage with a first sense resistor coupled between the first high-side switch and the supply voltage, such that an output current through a load coupled between the first output terminal and the second output terminal causes the first sense voltage proportional to the output current across the first sense resistor when the first high-side switch is activated;

measuring a second sense voltage with a second sense resistor coupled between the second high-side switch and the supply voltage, such that an output current through the load causes the second sense voltage proportional to the output current across the second sense resistor when the second high-side switch is activated;

determining the output current based on both of the first sense voltage and the second sense voltage; and calibrating for mismatch between common mode phases of the Class-D with a calibration subsystem comprising a first calibration resistor and a second calibration resistor and configured to calibrate for mismatch between common mode phases of the Class-D stage.

12. The method of claim 11, further comprising amplifying a difference between the first sense voltage and the second sense voltage to generate a combined sense voltage.

13. The method of claim 11, further comprising:

measuring a third sense voltage with a third sense resistor coupled between the first low-side switch and the ground voltage, such that an output current through the load causes the third sense voltage proportional to the output current across the third sense resistor when the first low-side switch is activated;

measuring a fourth sense voltage with a fourth sense resistor coupled between the second low-side switch and the ground voltage, such that an output current through the load causes the fourth sense voltage proportional to the output current across the third sense resistor when the second low-side switch is activated; and determining the output current based on the first sense voltage, the second sense voltage, the third sense voltage, and the fourth sense voltage.

14. The method of claim 13, further comprising:

amplifying a difference between the first sense voltage and the second sense voltage to generate a high-side sense voltage; and amplifying a difference between the third sense voltage and the fourth sense voltage to generate a low-side sense voltage.

15. The method of claim 14, further comprising combining the high-side sense voltage and the low-side sense voltage to generate a combined sense voltage indicative of the output current.

16. The method of claim 11, wherein the first calibration resistor is coupled between the first sense resistor and an amplifier and the second calibration resistor is coupled between the second sense resistor and the amplifier.

17. The method of claim 11, wherein the first calibration resistor and the second calibration resistor comprise feedback resistors of an amplifier.

18. The method of claim 11, further comprising:

calibrating a first variable resistance of the first calibration resistor when the second sense resistor is in a fully-differential current path of the output current; and calibrating a second variable resistance of the second calibration resistor when the first sense resistor is in the fully-differential current path of the output current.

19. The method of claim 11, further comprising:

calibrating a first variable resistance of the first calibration resistor when a polarity of the output current is a first polarity; and calibrating a second variable resistance of the first calibration resistor when the polarity of the output current is a second polarity.

20. The method of claim 19, further comprising alternating between calibration of the first variable resistance and the second variable resistance, and vice versa, at zero crossings of the output current.

* * * * *